United States Patent
Kwon et al.

(10) Patent No.: US 6,847,516 B2
(45) Date of Patent: Jan. 25, 2005

(54) ELECTROSTATIC CHUCK FOR PREVENTING AN ARC

(75) Inventors: Gi-Chung Kwon, Gyeonggi-do (KR); Hong-Sik Byun, Gyeonggi-do (KR); Sung-Weon Lee, Gyeonggi-do (KR); Hong-Seub Kim, Gyeonggi-do (KR); Sun-Seok Han, Gyeonggi-do (KR); Bu-Jin Ko, Daejeon (KR); Joung-Sik Kim, Choongcheongnam-do (KR)

(73) Assignee: Jusung Engineering Co., Ltd. (KR)

( * ) Notice: Subject to any disclaimer, the term of this patent is extended or adjusted under 35 U.S.C. 154(b) by 76 days.

(21) Appl. No.: 10/234,695

(22) Filed: Sep. 4, 2002

(65) Prior Publication Data

US 2003/0043530 A1 Mar. 6, 2003

(30) Foreign Application Priority Data

Sep. 5, 2001 (KR) .................................. 2001-54434

(51) Int. Cl.[7] .............................................. H01T 23/00

(52) U.S. Cl. ...................................................... 361/234
(58) Field of Search .......................................... 361/234

(56) References Cited

U.S. PATENT DOCUMENTS

| | | | | |
|---|---|---|---|---|
| 4,480,284 A | * | 10/1984 | Tojo et al. | 361/234 |
| 5,002,631 A | * | 3/1991 | Giapis et al. | 216/60 |
| 5,600,530 A | * | 2/1997 | Smith | 361/234 |
| 5,946,184 A | * | 8/1999 | Kanno et al. | 361/234 |

* cited by examiner

*Primary Examiner*—Brian Sircus
*Assistant Examiner*—James A Demakis
(74) *Attorney, Agent, or Firm*—Duane Morris LLP

(57) ABSTRACT

An electrostatic chuck includes: a metal plate; a dielectric layer on the metal plate, the dielectric layer and the metal plate having a lift pin hole and an injection hole of a cooling gas; a lift pin moving up-and-down through the lift pin hole; first protection insulator on an inner surface of the lift pin hole; and second protection insulator on an inner surface of the injection hole.

13 Claims, 3 Drawing Sheets

ELECTROSTATIC CHUCK FOR PREVENTING AN ARC

This application claims the benefit of Korean Patent Application No. 2001-54434, filed on Sep. 5, 2001, which is hereby incorporated by reference for all purposes as if fully set forth herein.

BACKGROUND OF THE INVENTION

1. Field of the Invention

The present invention relates to an electrostatic chuck, and more particularly to an electrostatic chuck to prevent generating an arc.

2. Discussion of the Related Art

Most apparatus of fabricating semiconductor devices use an electrostatic chuck to fix a wafer. However, there is a problem that an arc is generated at the electrostatic chuck when a radio frequency (RF) bias is applied to the electrostatic chuck.

FIG. 1 is a schematic cross-sectional view of a conventional electrostatic chuck.

In FIG. 1, an inner electrode 25 is formed on a metal plate 10 and a dielectic layer 20 is formed on the inner electrode 25, whereby the inner electrode 25 is interposed between the dielectric layer 20 and the metal plate 10. For example, If a polyimide layer If formed on a copper electrode, the polyimide layer and the copper electrode respectively become the dielectric layer 20 and the inner electrode 25. A wafer 30 is loaded on the dielectric layer 20. A wall 50 of a process chamber is grounded. After the wafer 30 is loaded on the dielectric layer 20 and process gases are injected into the process chamber, a first RF power is applied through an additional plasma electrode (not shown). As a result, a plasma 40 is generated in the process chamber. The plasma 40 functions as a conductor connecting the wall 50 of the process chamber arid the wafer 30. Here, if a negative voltage is applied to the Inner electrode 25, a clamping force that the wafer 30 and the metal plate 10 attract each other with the dielectric layer 20 interposed therebetween is generated. Accordingly, the wafer 30 is chucked onto the dielectric layer 20. A second RF power is applied to the metal plate 10 from the same power source of the first RF power or from an additional power source so that positive ions of the plasma can collide against the wafer 30 with a higher momentum due to a self-bias. Especially, this application of the second RF power is desirable to a plasma etching process such as a reactive ion etching (RIE). Moreover, the clamping force that the wafer 30 is chucked onto the dielectric layer 20 increases due to the self-bias.

Since the wafer 30 is heated due to a collision of ions during a plasma etching process, an injection hole 15 of a cooling gas is formed through the metal plate 10 and the dielectric layer 20 to cool the wafer 30. Generally, a helium (He) gas is supplied through the injection hole 15 and spread out on an entire surface of the dielectric layer 20 through a groove (not shown) formed on the dielectric layer 20. Since the wafer 30 is loaded on the dielectric layer 20, the supplied cooling gas does not leak out of the dielectric layer 20. Moreover, a lift pin hole 17 also formed through the metal plate 10 and the dielectric layer 20 and an ejection of the wafer 30 is promoted by an up-and-down movement of a lift pin 19 through the lift pin hole 17.

In the conventional electrostatic chuck, an arc is generated at one end "A" of the lift pin hole 17 and one end "B" of the injection hole 15 when the RF power is applied to the metal plate 10. Especially, the arc much more occurs for the lift pin hole 17 because the lift pin hole 17 has a longer diameter than the injection hole 15. Even though the wafer 30 is chucked onto the dielectric layer 20, the cooling gas such as He gas supplied through the injection hole 15 flows to the lift pin hole 17, thereby generating the arc at the end of the lift pin hole 17. If the cooling gas such as He gas near the end of the lift pin hole 17 is heated by a local increase of a temperature of the wafer 30, the wafer 30 and the electrostatic chuck are damaged by a plasma discharge generated at the lift pin hole 17.

SUMMARY OF THE INVENTION

Accordingly, the present invention is directed to an electrostatic chuck that substantially obviates one or more of problems due to limitations and disadvantages of the related art.

An advantage of the present invention is to provide an electrostatic chuck where a damage to a wafer is reduced and a lifetime of the electrostatic chuck is lengthened by preventing an arc an injection hole of a cooling gas and at lift pin hole.

Additional features and advantages of the invention will be set forth in the description that follows, and in part will be apparent from the description, or may be learned by practice of the invention. Other advantages of the invention will be realized and attained by the structure particularly pointed out in the written description and claims hereof as well as the appended drawings.

To achieve these and other advantages and in accordance with the purpose of the present invention, as embodied and broadly described, an electrostatic chuck includes: a metal plate; a dielectric layer on the metal plate, the dielectric layer and the metal plate having a lift pin hole and an injection hole of a cooling gas; a lift pin moving up-and-down through the lift pin hole; first protection insulator on an inner surface of the lift pin hole; and second protection insulator on an inner surface of the injection hole.

In the electrostatic chuck, the lift pin hole and the injection hole vertically penetrate the metal plate and the dielectric layer. The first and second protection insulators may be a ceramic including one of aluminum nitride (AlN) and aluminum oxide ($Al_2O_3$). Further, the first and second protection insulators may be disposed only in the metal plate and formed through an anodizing process. A power of radio frequency (RF) and a voltage of negative direct current (DC) are applied to the metal plate. The electrostatic chuck further includes an inner electrode on the metal plate. A power of RF may be applied to the metal plate and a voltage of negative DC may be applied to the inner electrode. Otherwise, a voltage of negative DC may be applied to the metal plate arid a power of RF may be applied to the inner electrode. The electrostatic chuck further includes an Insulator surrounding the metal plate and a third protection insulator between the metal plate and the insulator.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, similar reference numbers will be used throughout the drawings to refer to the same or like parts.

Figure 1:
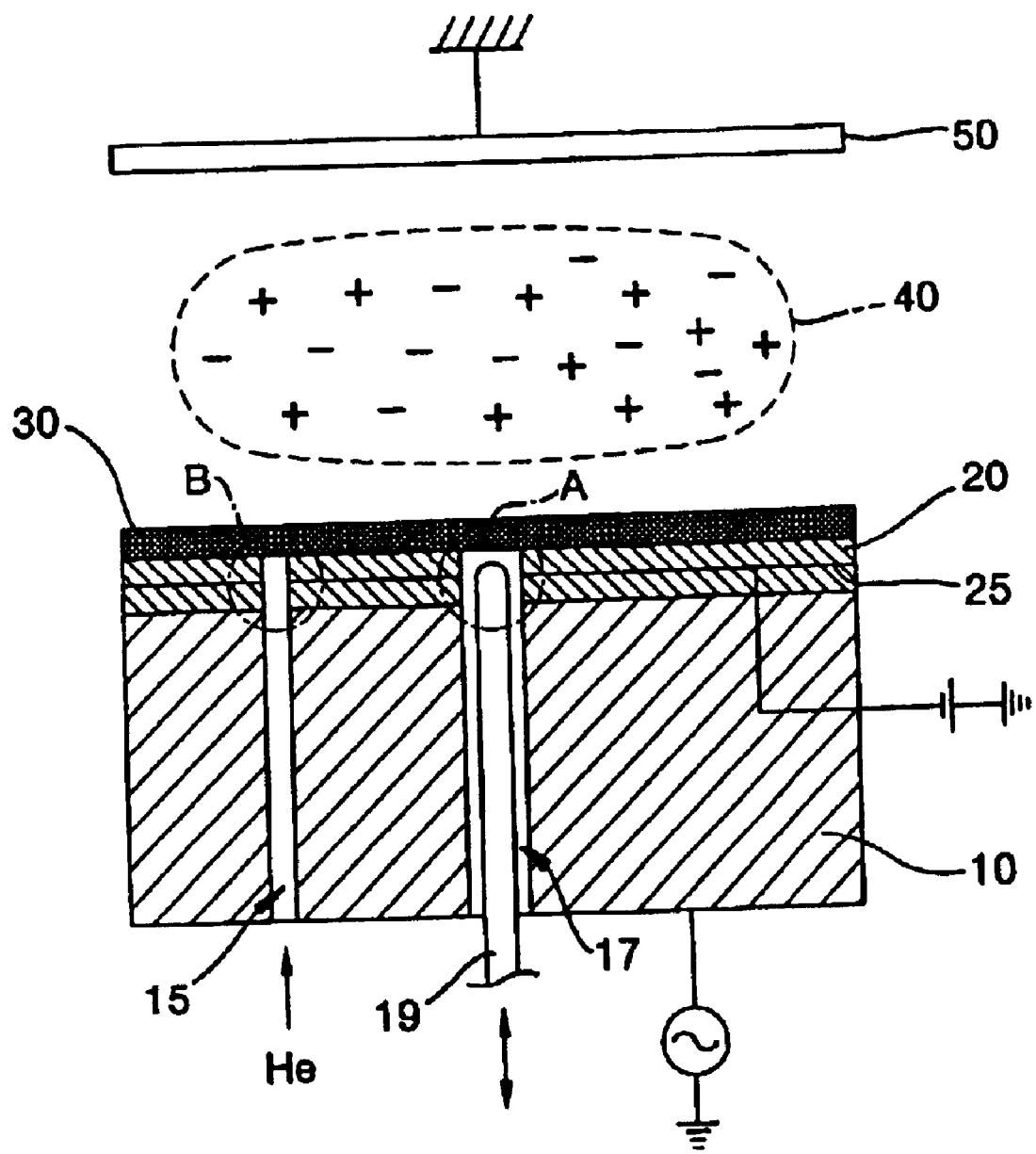
FIG. 1 is a schematic cross-sectional view of a conventional electrostatic chuck.
Figure 2:
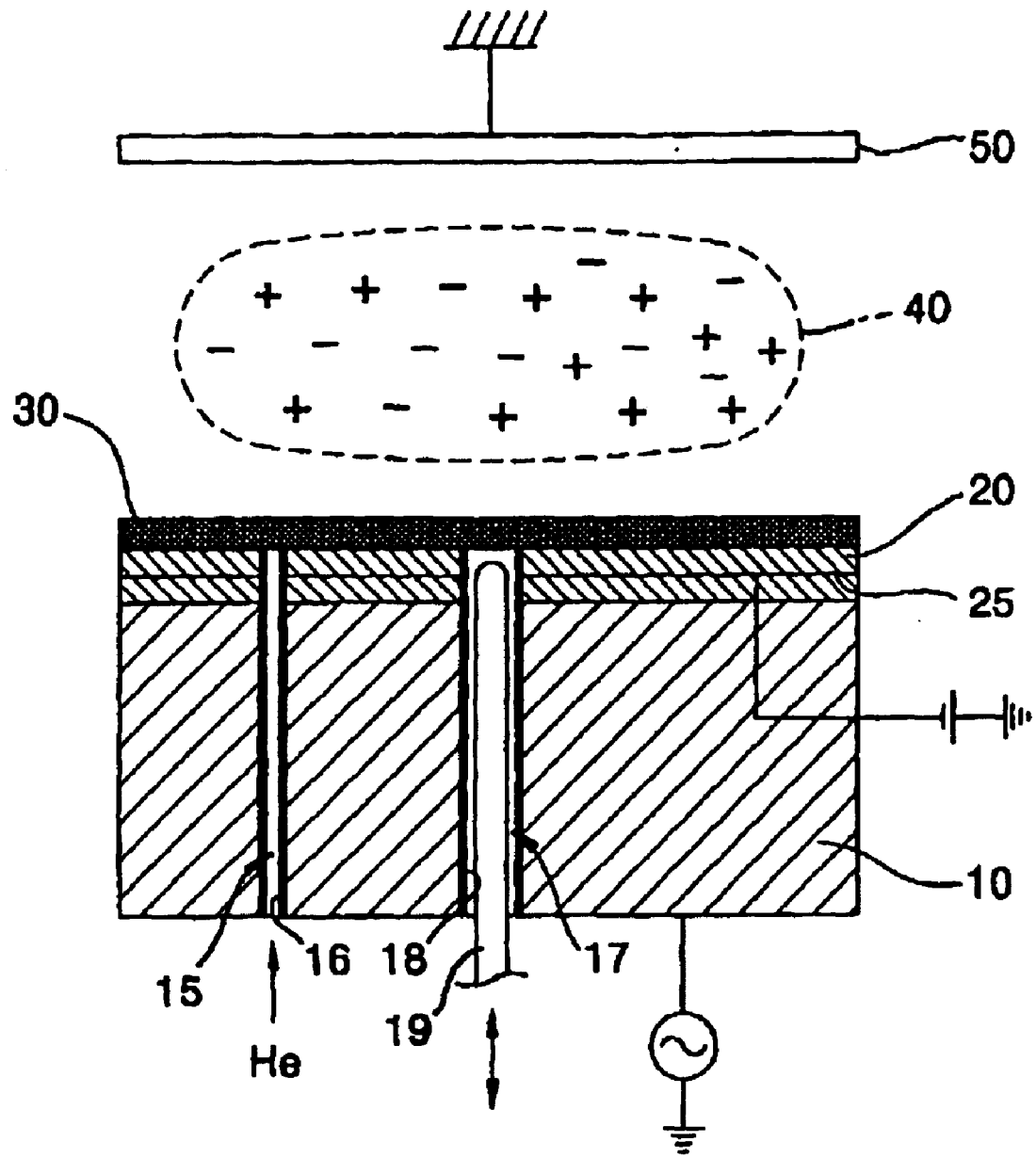
FIG. 2 is a schematic cross-sectional view of an electrostatic chuck according to an exemplary embodiment of the present invention.

FIG. 2 is a schematic cross-sectional view of an electrostatic chuck according to an exemplary embodiment of the present invention. Since the electrostatic chuck of FIG. 2 is similar to that of FIG. 1, the same numerals are used for the same elements and duplicate illustrations is omitted.

In FIG. 2, since first and second protection insulators 16 and 18 are formed on an inner surface of an injection hole 15 of a cooling gas and a lift pin hole 17, an arc of an interior of the injection hole 15 and the lift pin hole 17 is prevented. The first and second protection insulators 16 and 18 may be formed through a coating process or by interposing an insulating tube. When a metal plate 10 is made of aluminum (Al), the first and second protection insulators 16 and 18 may be formed through an anodizing process. If a ceramic having a high permittivity such as aluminum nitride (AlN) or aluminum oxide ($Al_2O_3$) is used as the first and second protection insulators 16 and 18, the arc is effectively prevented because an electric field generated by an RF power is greatly reduced.

In this exemplary embodiment, a power of radio frequency (RF) is applied to the metal plate 10 and a voltage of negative direct current (DC) is applied to an inner electrode 25. In another exemplary embodiment, a voltage of negative DC may be applied to the metal plate 10 and a power of RF may be applied to the inner electrode 25. Further, a power of RF and a voltage of negative DC may be simultaneously applied to the metal plate 10 without the inner electrode 25. The metal plate 10 may be used as a plasma electrode by applying a power of RF to the metal plate 10 without an additional plasma electrode.

Figure 3:
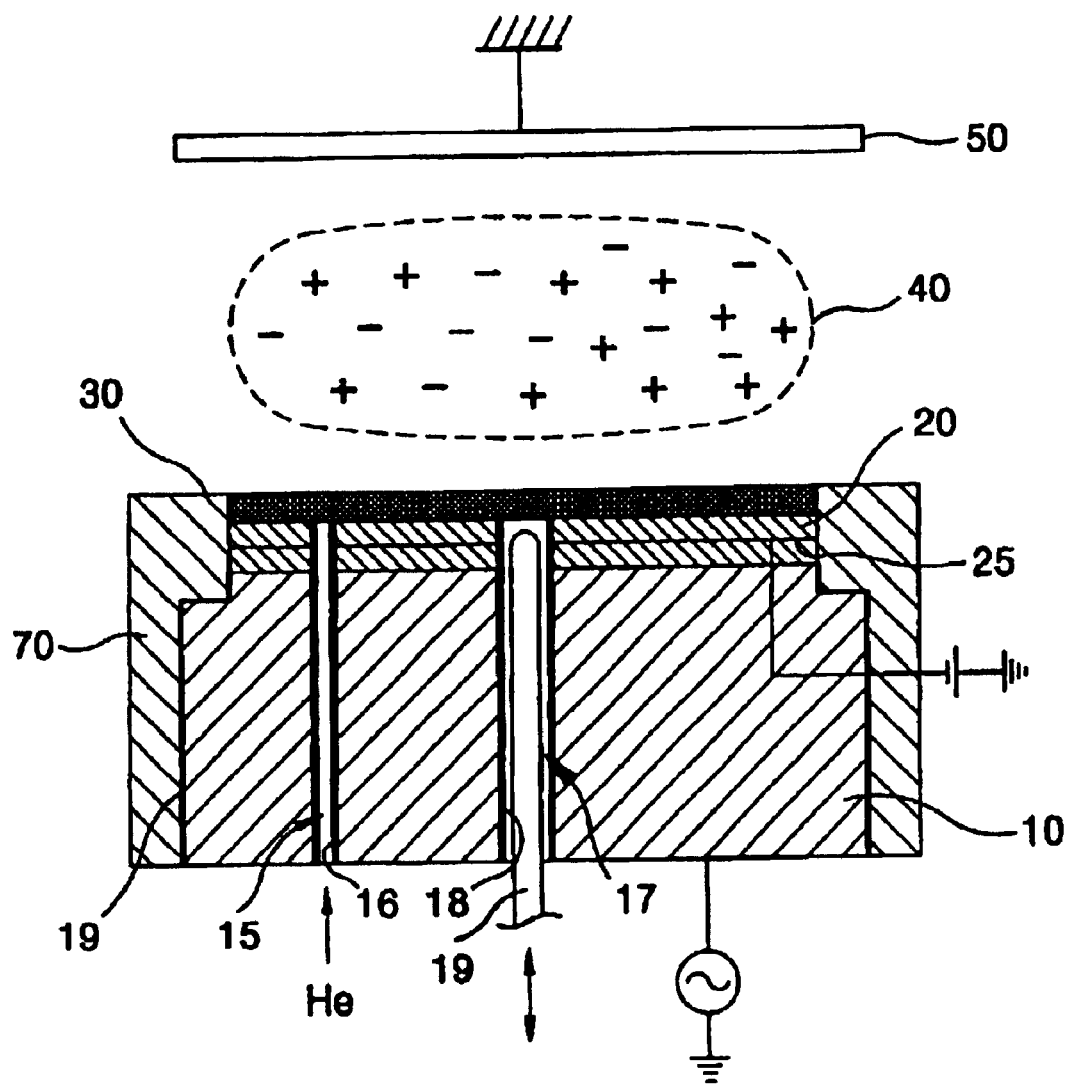
FIG. 3 is a schematic cross-sectional view of an electrostatic chuck according to another exemplary embodiment of the present invention.

FIG. 3 is a schematic cross-sectional view of an electrostatic chuck according to another exemplary embodiment of the present invention.

In FIG. 3, an insulator 70 surrounds a metal plate 10. If there is a minute gap between the metal plate 10 and the insulator 70, a voltage difference is generated between the metal plate 10 and the insulator 70. Accordingly, a minute plasma arc may be generated. To prevent this minute plasma arc, it is preferable to form a third protection insulator 22 between the metal plate 10 and the insulator 70. The third protection insulator 22 may be coated on an outer surface of the metal plate 10 through a spray coating method.

Consequently, an arc generation at an injection hole of a cooling gas and a lift pin hole is prevented due to a first and second protection insulator on an inner surface of the injection hole and the lift pin hole when a power of RF is applied to an electrostatic chuck. Accordingly, a damage to a wafer is reduced and a lifetime of the electrostatic chuck is lengthened. Even when an insulator surrounds the metal plate, the same effect may be obtained by coating a third protection insulator between the metal plate and the insulator.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electrostatic chuck, comprising:

a metal plate;

an inner electrode on the metal plate;

a dielectric layer on the inner electrode, the dielectric layer, the inner electrode and the metal plate having a lift pin hole and an injection hole of a cooling gas;

a lift pin moving up-and-down through the lift pin hole;

a first protection insulator on an inner surface of the lift pin hole; and a second protection insulator on an inner surface of the injection hole;

an insulator surrounding side walls of the metal plate, the dielectric layer and the inner electrode; and a third protection insulator surrounding a side wall of the metal plate and interposed between the metal plate and the insulator.

2. The chuck according to claim 1, wherein the lift pin hole and the injection hole vertically penetrate the metal plate and the dielectric layer.

3. The chuck according to claim 1, wherein the first and second protection insulators include a ceramic.

4. The chuck according to claim 3, wherein the ceramic has one of aluminum nitride (AlN) and aluminum oxide ($Al_2O_3$).

5. The chuck according to claim 1, wherein the first and second protection insulators are disposed in the metal plate.

6. The chuck according to claim 5, wherein the first and second protection insulators are formed through an anodizing process.

7. The chuck according to claim 1, wherein a power and a voltage are applied to the metal plate.

8. The chuck according to claim 7, wherein the power has radio frequency (RF) and the voltage has negative direct current (DC).

9. The chuck according to claim 1 wherein a power is applied to the metal plate and a voltage is applied to the inner electrode.

10. The chuck according to claim 9, wherein the power has rad frequency (RF) and the voltage has negative direct current (DC).

11. The chuck according to claim 1 wherein a voltage is applied to the metal plate and a power is applied to the inner electrode.

12. The chuck according to claim 11 wherein the voltage has negative direct current (DC) and the power has radio frequency (RF).

13. An electrostatic chuck, comprising:

a metal plate;

an inner electrode on the metal plate;

a dielectric layer on the inner electrode, wherein the dielectric layer, the inner electrode and the metal plate have a lift pin hole and an injection hole of a cooling gas;

a lift pin moving up-and-down through the lift pin hole;
a first protection insulator on an inner surface of the lift pin hole; and
a second protection insulator on an inner surface of the injection hole;
an insulator surrounding the side walls of the metal plate, the dielectric layer and the inner electrode, wherein the insulator comes in contact with the side walls of the dielectric layer and the inner electrode; and
a third protection insulator surrounding the side wall of the metal plate and interposed between the metal plate and the insulator.

* * * * *